(12) United States Patent
Tsai et al.

(10) Patent No.: US 10,164,649 B2
(45) Date of Patent: Dec. 25, 2018

(54) HYBRID PHASE LOCK LOOP

(71) Applicant: Taiwan Semiconductor Manufacturing Co., Ltd., Hsinchu (TW)

(72) Inventors: Tsung-Hsien Tsai, Zhongli (TW); Ruey-Bin Sheen, Taichung (TW); Chih-Hsien Chang, New Taipei (TW); Cheng-Hsiang Hsieh, Taipei (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 15/428,841

(22) Filed: Feb. 9, 2017

(65) Prior Publication Data

US 2018/0152192 A1    May 31, 2018

Related U.S. Application Data

(60) Provisional application No. 62/428,146, filed on Nov. 30, 2016.

(51) Int. Cl.
    *H03L 7/06*     (2006.01)
    *H03L 7/099*    (2006.01)
    (Continued)

(52) U.S. Cl.
    CPC ............ *H03L 7/0991* (2013.01); *H03L 7/085* (2013.01); *H03L 7/087* (2013.01); *H03L 7/0995* (2013.01);
    (Continued)

(58) Field of Classification Search
    USPC .................................. 327/147–149, 156–158
    See application file for complete search history.

(56) References Cited

U.S. PATENT DOCUMENTS

| 4,272,729 A | 6/1981 | Riley, Jr. |
| 5,382,921 A | 1/1995 | Estrada et al. |

(Continued)

FOREIGN PATENT DOCUMENTS

DE    11 2008 002 478 T5    7/2010

OTHER PUBLICATIONS

He et al., "A Low-Cost, Leakage-Insensitive Semi-Digital PLL with Linear Phase Detection and FIR-Embedded Digital Frequency Acquisition," 2010 IEEE Asian Solid-State Circuits Conference, Nov. 8-10, 2010; 4 pages.

(Continued)

*Primary Examiner* — Adam Houston
(74) *Attorney, Agent, or Firm* — Sterne, Kessler, Goldstein & Fox P.L.L.C.

(57) ABSTRACT

Hybrid phase lock loop (PLL) devices are provided that combine advantages of the digital controlled loop and the analog controlled loop. For example, a hybrid PLL includes a digital controlled loop that receives a reference input signal and an output signal of the hybrid PLL, and generates a digital tuning word. The hybrid PLL further includes an analog controlled loop that receives the reference input signal and the output signal of the hybrid PLL, and generates an output voltage. The hybrid PLL also includes a hybrid oscillator. An oscillator controller of the digital controlled loop controls the hybrid oscillator using the digital tuning word and disables the analog controlled loop during a frequency tracking operation mode of the hybrid PLL. The oscillator controller enables the analog controlled loop to control the hybrid oscillator during the phase tracking operation mode of the hybrid PLL.

20 Claims, 10 Drawing Sheets

(51) Int. Cl.
*H03L 7/085* (2006.01)
*H03L 7/087* (2006.01)
*H03L 7/113* (2006.01)
*H03L 7/183* (2006.01)

(52) U.S. Cl.
CPC .............. *H03L 7/113* (2013.01); *H03L 7/183* (2013.01); *H03L 2207/06* (2013.01)

(56) References Cited

U.S. PATENT DOCUMENTS

| | | | |
|---|---|---|---|
| 5,487,093 A | 1/1996 | Adresen et al. | |
| 6,028,460 A * | 2/2000 | McCollum et al. | H03L 7/095 327/105 |
| 7,084,709 B1 * | 8/2006 | Leong et al. | H03L 7/087 327/156 |
| 7,180,377 B1 * | 2/2007 | Leong et al. | H03L 7/087 327/157 |
| 7,692,501 B2 | 4/2010 | Hsueh et al. | |
| 8,169,242 B2 | 5/2012 | Abbasi et al. | |
| 8,368,437 B2 | 2/2013 | Huang et al. | |
| 8,456,207 B1 | 6/2013 | Kuo et al. | |
| 8,547,151 B2 | 10/2013 | Kuo et al. | |
| 8,553,827 B2 * | 10/2013 | Zhang | H03L 7/093 327/147 |
| 8,570,082 B1 | 10/2013 | Kuo et al. | |
| 8,593,189 B1 | 11/2013 | Yen et al. | |
| 8,779,812 B1 * | 7/2014 | Kavanagh | H03L 7/087 327/150 |
| 8,872,558 B1 | 10/2014 | Rey et al. | |
| 8,890,626 B2 | 11/2014 | Chen et al. | |
| 8,922,253 B2 | 12/2014 | Rey et al. | |
| 9,065,454 B2 | 6/2015 | Lin | |
| 9,112,507 B2 | 8/2015 | Chen et al. | |
| 9,705,514 B2 * | 7/2017 | Perrott | H03L 7/0991 |
| 9,853,807 B2 | 12/2017 | Tsai et al. | |
| 2004/0223575 A1 | 11/2004 | Meltzer et al. | |
| 2007/0247202 A1 * | 10/2007 | Lin et al. | H03L 7/07 327/158 |
| 2010/0329372 A1 * | 12/2010 | Grewing et al. | H04L 27/0014 375/260 |
| 2011/0227615 A1 * | 9/2011 | Faison | H03L 7/099 327/157 |
| 2012/0313676 A1 * | 12/2012 | Nguyen | H03L 7/23 327/156 |
| 2013/0285722 A1 | 10/2013 | Chou | |
| 2014/0077849 A1 * | 3/2014 | Chen | H03L 7/08 327/156 |
| 2014/0347109 A1 | 11/2014 | Rey et al. | |
| 2014/0354335 A1 * | 12/2014 | Syllaios | H03L 7/085 327/157 |
| 2014/0354336 A1 * | 12/2014 | Syllaios | H03L 7/093 327/157 |
| 2015/0145566 A1 * | 5/2015 | Perrott | H03L 7/0991 327/154 |
| 2015/0162921 A1 | 6/2015 | Chen | |
| 2015/0194971 A1 | 7/2015 | Tsai | |
| 2015/0221285 A1 * | 8/2015 | Song | G09G 3/3208 345/210 |
| 2016/0072514 A1 | 3/2016 | Tsai | |
| 2017/0310457 A1 | 10/2017 | Tsai et al. | |
| 2018/0152192 A1 * | 5/2018 | Tsai | H03L 7/087 |

OTHER PUBLICATIONS

Moon et al., "A 0.4-V, 500-MHz, Ultra-Low-Power Phase-Locked Loop for Near-Threshold Voltage Operation," 2014 IEEE Custom Integrated Circuits Conference, Sep. 2014; 4 pages.

* cited by examiner

HYBRID PHASE LOCK LOOP

CROSS REFERENCE TO RELATED APPLICATIONS

The present application claims the benefit of U.S. Provisional Patent Application No. 62/428,146, filed on Nov. 30, 2016, which is hereby incorporated by reference in its entirety.

BACKGROUND

This disclosure generally relates to phase lock loop circuits.

A phase lock loop (PLL) circuit is an electronic control circuit that generates an output clock signal having a phase that is locked to the phase of an input reference signal. For example, a PLL can be used to adjust an oscillator so that a frequency and phase of a signal generated by the oscillator matches the frequency and phase of a reference input signal. A PLL circuit is commonly used in communication devices, computers, and other electronic devices. An analog PLL circuit uses analog components to provide the phase lock architecture. These analog components include a phase detector, a voltage-controlled oscillator (VCO), and a feedback path between the VCO output signal and an input port of the phase detector. By connecting the input reference signal to another input port of the phase detector, the output of the phase detector may be used to adjust the phase and/or the frequency of the VCO output signal until that phase and/or frequency is locked to the input reference signal.

A PLL circuit may also be implemented using all digital components. Such a PLL circuit is known as an all-digital PLL (ADPLL) circuit. Like its analog counterpart, an ADPLL circuit uses a feedback path to return a digitally-controlled oscillator (DCO) clock signal to generate a digital phase error signal based on the output from a time-to-digital converter (TDC) and a reference phase signal. In response to the digital phase error signal, the phase of the DCO clock signal is adjusted.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
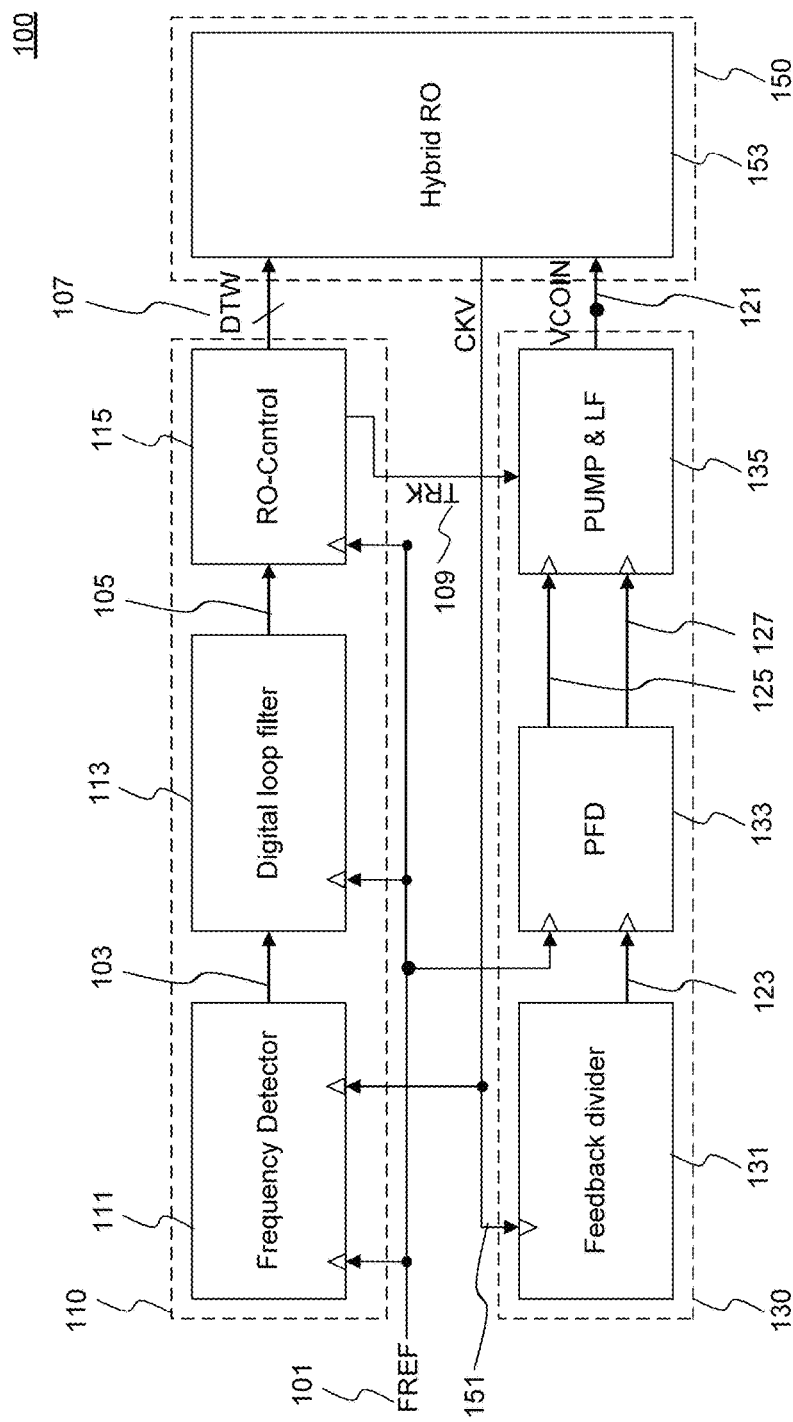
FIG. 1 is a block diagram of an exemplary hybrid PLL, according to an embodiment of the present disclosure

The following disclosure provides many different embodiments, or examples, for implementing different features of the provided subject matter. Specific examples of components and arrangements are described below to simplify the present disclosure. These are, of course, merely examples and are not intended to be limiting. For example, the present disclosure may repeat reference numerals and/or letters in the various examples. This repetition does not in itself dictate a relationship between the various embodiments and/or configurations discussed.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "about" as used herein indicates the value of a given quantity varies by +10% of the value, unless noted otherwise.

A phase lock loop (PLL), such as a hybrid phase lock loop to provide an example, of the present disclosure can be used to adjust its oscillator so that a frequency and/or a phase of an output signal generated by the oscillator is proportional to a frequency and/or a phase of a reference input signal. The PLL includes a phase and/or frequency detector that provides an error signal representing a difference, in frequency and/or phase, between the output signal and the reference input signal. This error signal can be measured to ensure that the frequency and/or the phase of the output signal is proportional to the frequency and/or the phase of the reference signal. For example, as the PLL adjusts the oscillator, the frequency and/or the phase of the output signal can gradually become closer to the frequency of the reference input signal. When the frequency and the phase of the output signal is proportional to the frequency and/or the phase of the reference input signal, the PLL is said to be locked onto the reference input signal. The time it takes for the frequency and/or phase of the output signal to become proportional to the frequency and/or the phase of the reference input signal can be referred to as the locking time.

In an embodiment, the hybrid PLL of this disclosure operates in a frequency tracking mode to adjust the frequency of the output signal to be proportional to a frequency of the reference input signal, or, in a phase tracking mode to adjust a phase of the output signal to match any variations in the reference input signal. The frequency tracking mode is performed by a digital controlled loop of the hybrid PLL. The digital controlled loop (DCL) of the hybrid PLL can provide fast tracking for reducing the locking time. On the other hand, the phase tracking mode is performed by an analog controlled loop of the hybrid PLL. The analog controlled loop (ACL) of the hybrid PLL can provide very little, or no, quantization noise at steady state. By combining the DCL and ACL, the hybrid PLL can solve the problems with the large gain of a voltage-controlled oscillator (VCO) of an analog PLL (APLL), and the quantization noise caused by an all-digital PLL (ADPLL)

FIG. 1 is a block diagram of an exemplary hybrid PLL 100 according to an embodiment of the present disclosure. A reference input signal 101 represents a first time-varying signal, such as a sine wave to provide some examples, having a frequency $f_{REF}$ and a phase $\phi_{REF}$. Similarly, an output signal 151 represents a second time-varying signal having a frequency $f_{OUT}$ and a phase $\phi_{OUT}$. Herein, the frequency $f_{REF}$ and the phase $\phi_{REF}$ of the first time-varying signal is referred to as the $f_{REF}$ and the phase $\phi_{REF}$, respectively. Similarly, the frequency $f_{OUT}$ and the phase $\phi_{OUT}$ of the second time-varying signal is referred to as the $f_{OUT}$ and the phase $\phi_{OUT}$, respectively. Hybrid PLL 100 adjusts output signal 151 such that the frequency for and/or the phase $\phi_{OUT}$ is proportional to the frequency $f_{REF}$ and/or the phase $\phi_{REF}$. Hybrid PLL 100 can operate in the frequency tracking mode to adjust the frequency $f_{OUT}$ to be proportional to the frequency $f_{REF}$ or in the phase tracking mode to adjust the phase $\phi_{OUT}$ to match, or substantially match, the phase REF.

Hybrid PLL 100 can be implemented using a frequency detector 111, a digital loop filter 113, an oscillator controller 115, a feedback divider 131, a phase frequency detector (PFD) 133, a charge pump and analog filter 135, and a hybrid oscillator 153.

The components of hybrid PLL 100 can be divided in three portions—DCL 110, ACL 130, and oscillator circuit 150. DCL 110 includes frequency detector 111, digital loop filter 113, and oscillator controller 115 and is configured to perform the frequency tracking mode of hybrid PLL 100. The components of DCL 110 can be implemented using digital components. DCL 110 is configured to generate a digital signal (digital tuning word 107) that controls hybrid oscillator 153 during the frequency tracking operation mode of the hybrid PLL.

In one embodiment, ACL 130 includes feedback driver 131, phase frequency detector 133, and charge pump and analog filter 135 and is configured to perform the phase tracking mode of hybrid PLL 100. The components of ACL 130 can be implemented using analog components or using analog and digital components. For example, charge pump and filter 135 of ACL 130 can be implemented using analog components; and phase frequency detector 133 and feedback divider 131 of ACL 130 can be implemented using analog and/or digital components. ACL 130 is configured to generate an analog signal (output voltage 121 (VCOIN)) that controls hybrid oscillator 153 during the phase tracking operation mode of the hybrid PLL.

In this embodiment, oscillator circuit 150 of PLL 100 includes hybrid oscillator 153 and is configured to provide discrete frequency tuning in the frequency tracking mode and continuous frequency tuning in the phase tracking mode. In one example, hybrid oscillator 153 is implemented using analog components. The components of oscillator circuit 150 can be implemented using analog components. Alternatively, ACL 130 can include feedback divider 131 and phase frequency detector 133. In this example, charge pump and analog filter 135 can be included in oscillator circuit 150 with hybrid oscillator 153. In one embodiment of this example, oscillator circuit 150 can be implemented using analog components.

Frequency detector 111 receives input signal 101 and output signal 151. Frequency detector 111 compares the frequency $f_{OUT}$ of output signal 151 and the frequency $f_{REF}$ of input signal 101 to provide an error signal 103. In one example, frequency detector 111 is configured to convert at least one of output signal 151 and input signal 101 into digital signals before comparing the frequencies. Frequency detector 111 provides digital error signal 103. If error signal 103 is zero or close to zero, it indicates that the frequency $f_{OUT}$ of output signal 151 is tracking and/or is a multiple of the frequency $f_{REF}$ of input signal 101.

Digital loop filter 113 is configured to control the bandwidth of hybrid PLL 100 in DCL mode. Digital loop filter 113 receives error signal 103. Error signal 103 represents a digital representation of a third time-varying signal. In one example, digital loop filter 113 suppresses high frequency components in the third time-varying signal which are outside of its bandwidth to provide samples of a direct current (DC), or near DC, component of the third time-varying signal within its bandwidth as the signal 105.

Oscillator controller 115 receives signal 105 from digital loop filter 113 and reference input signal 101. Oscillator controller 115 is configured to analyze signal 105 and reference input signal 101 and generate digital tuning word 107 and tracking signal 109. During the frequency tracking mode where hybrid PLL 100 is using DCL 110, digital tuning word 107 is used to control the frequency of hybrid oscillator 153. In one example, oscillator controller 115 generates digital tuning word 107 by multiplying signal 105 by a normalization value ($NROM_{RO}=f_{REF}/Gain_{RO}$) to provide process effect cancellation. In one example, the tolerance of the normalization value for DCL can reach around +100%. Also, an incorrect normalization value can affect only tracking time and not stability of hybrid PLL 100. Oscillator controller 115 can also include a function of retiming to avoid frequency glitches when digital tuning words transition. Digital tuning word 107 is an input signal to hybrid oscillator 153 to tune the frequency of hybrid oscillator 153. DCL 110 of hybrid PLL 100 performs the frequency tracking mode by tuning digital tuning word 107. In one example, digital tuning word 107 can be a 5-bit binary code, which can provide a wide frequency tuning range.

In addition to generating digital tuning word 107, oscillator controller 115 controls the overall configuration and operation of hybrid PLL 100. Oscillator controller 115 configures hybrid PLL 100 to operate the frequency tracking mode using DCL 110. In the frequency tracking mode using DCL 110, oscillator controller 115 disables tracking signal 109 by setting tracking signal 109 to a first logical level (e.g., low logical level.) Hybrid oscillator 153 adjusts output signal 151 to adjust the frequency $f_{OUT}$ in the frequency tracking mode based on the received digital tuning word 107. Thereafter, oscillator controller 115 monitors signal 105 (which is created based on error signal 103) to determine a condition to switch to phase tracking mode. Once oscillator controller 115 detects the switching condition, oscillator controller 115 configures hybrid PLL 100 to operate in the phase tracking mode using ACL 130 (e.g., enables ACL 130)

The switching condition indicates the frequency $f_{REF}$ is sufficiently close to the frequency $f_{OUT}$ to allow hybrid oscillator to lock onto reference input signal 101 in the phase tracking mode of operation using ACL 130.

In the phase tracking mode of operation using ACL 130, oscillator controller 115 enables tracking signal 109 by setting tracking signal 109 to a second logical level (e.g., high logical level.) Hybrid oscillator 153, using ACL 130, adjusts output signal 151 to adjust the phase $\phi_{OUT}$ in the phase tracking mode. When the phase component of the error signal output of phase frequency detector 133 is minimized, the phase $\phi_{OUT}$ is sufficiently close to the phase $\phi_{REF}$. In this situation, the hybrid oscillator is locked onto the reference input signal 101 so as to track any variations in the frequency $f_{REF}$ and the phase $\phi_{REF}$.

According to one example, oscillator controller 115 is configured to determine the switching condition by monitoring the signal 105 (which is created based on error signal 103) to determine a trend, for example, a positive trend, a flat trend, and/or a negative trend in signal 105. An example of this trend detection process is discussed in U.S. patent application Ser. No. 15/135,212, filed Apr. 5, 2016 and titled "Automatic Detection of Change in PLL Locking Trend," which is incorporated by reference in its entirety. The positive trend indicates a digital value of signal 105 is increasing from a previous value of signal 105, the flat trend indicates the digital value of signal 105 is substantially unchanged from the previous value of signal 105, and the negative trend indicates the digital value of signal 105 is decreasing from the previous value of signal 105. Once oscillator controller 115 detects a first change in the trend of signal 105, for example, from the positive trend to the flat trend or the negative trend to the flat trend, oscillator controller 115 configures hybrid PLL 100 to use ACL 130 to operate in the phase tracking mode.

Similarly, while hybrid PLL 100 is configured to use ACL 130 to operate in the phase tracking mode, oscillator controller 115 is configured to monitor the error signal 103 to determine whether a second change in the trend of the error signal occurs. The second change in trend can include a change from the flat trend to the positive trend or from a flat trend to the negative trend. The second change in the trend can indicate that the frequency of the output signal 151 is no longer sufficiently close to the frequency of the reference input signal 101. If oscillator controller 115 detects a second change in the trend of error signal 103, oscillator controller 115 configures hybrid PLL 100 to use DCL 110 to operate again in the frequency tracking mode.

According to some embodiments, ACL 130 includes feedback divider 131, phase frequency detector 133, and charge pump and analog filter 135. Before hybrid PLL 100 enters the phase tracking mode using ACL 130, tracking signal 109 is set to the first logical level (e.g., low logical level) and output voltage 121 (VCOIN) is set to a fixed voltage (e.g., VDD/2). Hybrid PLL 100 starts operating in the phase tracking mode using ACL 130 when oscillator controller 115 enables tracking signal 109 by setting tracking signal 109 to a second logical level (e.g., high logical level.)

Feedback divider 131 is a synchronous high speed divider driven by output signal 151. Feedback divider 131 receives output signal 151 and generates feedback signal 123. Phase frequency detector 133 receives feedback signal 123 and reference input signal 101. Phase frequency detector 133 is configured to detect the phase difference (and/or frequency difference) between feedback signal 123 and reference input signal 101. Phase frequency detector 133 generates two output signals with narrow pulse width (e.g., around 40 ps)—UP signal 125 and DN signal 127. The pulse signals UP signal 125 and DN signal 127 are input to charge pump and analog filter 135. Although FIG. 1 is described with the phase frequency detector 133, it is noted that other phase detectors/comparators can also be used.

Charge pump and analog filter 135 can include a charge pump and a loop filter. The charge pump of charge pump and analog filter 135 converts the UP signal 125 and DN signal 127 to a corresponding UP/DN current. The analog filter of charge pump and analog filter 135 converts the UP/DN current output of the charge pump into the output voltage 121 (VCOIN). Output voltage 121 (VCOIN) is input to hybrid oscillator 153. As discussed above, during the frequency tracking mode using DCL 110 of hybrid PLL 100, tracking signal 109 (which is input to charge pump and analog filter 135) is set to the first logical level (e.g., low logical level) and therefore, output voltage 121 (VCOIN) is set to a fixed voltage (e.g., VDD/2). When hybrid PLL 100 starts operating in the phase tracking mode using ACL 130, tracking signal 109 is set to a second logical level (e.g., high logical level) and output voltage 121 (VCOIN) is used for phase tracking. During the phase tracking mode using ACL 130, digital tuning word 107 is frozen.

Hybrid oscillator 153 is configured to receive digital tuning word 107 and output voltage 121 (VCOIN) and generate output signal 151. As discussed above, digital tuning word 107 (e.g., a 32 thermometer code) is used during the frequency tracking mode using DCL 110. Using digital tuning word 107 generated by DCL 110, hybrid oscillator 153 adjusts the frequency $f_{OUT}$ of output signal 151 to be in a range that is sufficiently close, or closer than before tuning, to the frequency $f_{REF}$ of reference input signal 101. On the other hand, output voltage 121 (VCOIN) is used during the phase tracking mode using ACL 130. In one example, output voltage 121 (VCOIN) is a continuous voltage in the tuning range of about 0.2 volts or 0.3 volts to VDD (e.g., the core supply voltage). Hybrid oscillator 153 fine tunes the frequency $f_{OUT}$ of output signal 151 and adjusts the phase $\phi_{OUT}$ of output signal 151 in accordance with output voltage 121 (VCOIN) generated by ACL 130 to track the frequency $f_{REF}$ and the phase $\phi_{REF}$ of reference input signal.

Figure 2:
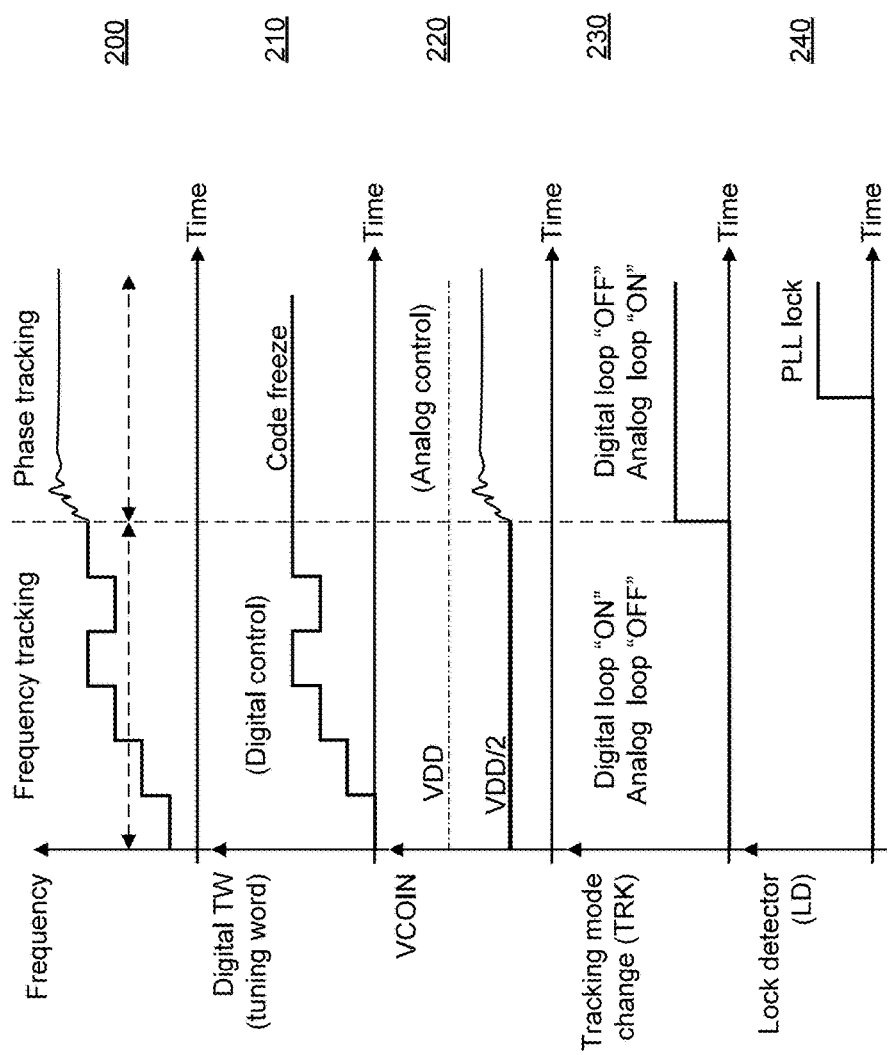
FIG. 2 illustrates timing diagrams for an exemplary hybrid PLL, according to an embodiment of the present disclosure.

FIG. 2 illustrates timing diagrams for hybrid PLL 100, according to some embodiments of present disclosure. Graph 200 illustrates the frequency $f_{OUT}$ of output signal 151 versus time. As illustrated in graph 200, in the frequency tracking mode of graph 200, hybrid PLL 100 uses DCL 110 to track the frequency $f_{REF}$ of reference input signal 101. In the phase tracking mode of graph 200, hybrid PLL 100 uses ACL 130 to track the phase $\phi_{REF}$ of reference input signal 101. The phase tracking mode also includes fine tuning the frequency $f_{OUT}$ of output signal 151 such that hybrid PLL 100 tracks the frequency $f_{REF}$ and the phase $\phi_{REF}$ of reference input signal 101.

Graph 210 illustrates digital tuning word 107 versus time. During the frequency tracking mode of graph 210, digital tuning word 107 is adjusted by DCL 110 based on the difference between the frequency $f_{OUT}$ of output signal 151 and the frequency $f_{REF}$ of reference input signal 101. During the frequency tracking mode, the frequency $f_{OUT}$ of output signal 151 illustrated in graph 200, follows digital tuning word 107 as illustrated in graph 210. When the switch condition (switch between the frequency tracking mode of operation and the phase tracking mode of operation) is met, hybrid PLL 100 switches to the phase tracking mode using ACL 130. During the phase tacking mode of graph 210, digital tuning word 107 is fixed.

Graph 220 illustrates output voltage 121 (VCOIN) versus time. During the frequency tracking mode of operation, charge pump and analog filter 135 is disabled. Therefore, output voltage 121 (VCOIN) is kept at a fixed voltage. In one exemplary embodiment, the fixed voltage can be half of VDD (e.g., 0.38 volts.) However, the embodiments of this disclosure are not limited to this value. When hybrid PLL 100 switches from the frequency tracking mode using DCL 110 to the phase tracking mode using ACL 130, ACL 130 and charge pump and analog filter 135 are enabled. Accordingly, output voltage 121 (VCOIN) is adjusted by ACL 130 based on the difference between the phase $\phi_{OUT}$ of output signal 151 and the phase $\phi_{REF}$ of reference input signal 101. During the phase tracking operation mode, the output voltage of the analog controlled loop (VCOIN 121) tracks phase of the reference input signal.

Graph 230 illustrates tracking signal 109 versus time. In the frequency tracking mode of operation, tracking signal 109 is disabled by being set to the first logical level (e.g., low logical level.) In the phase tracking mode using ACL 130, oscillator controller 115 enables tracking signal 109 by setting tracking signal 109 to the second logical level (e.g., high logical level.) Graph 240 illustrates the locking time, when hybrid PLL 100 is locked onto the reference input signal. Lock occurs when the frequency and the phase of the output signal is proportional to the frequency and/or the phase of the reference input signal.

Figure 3A:
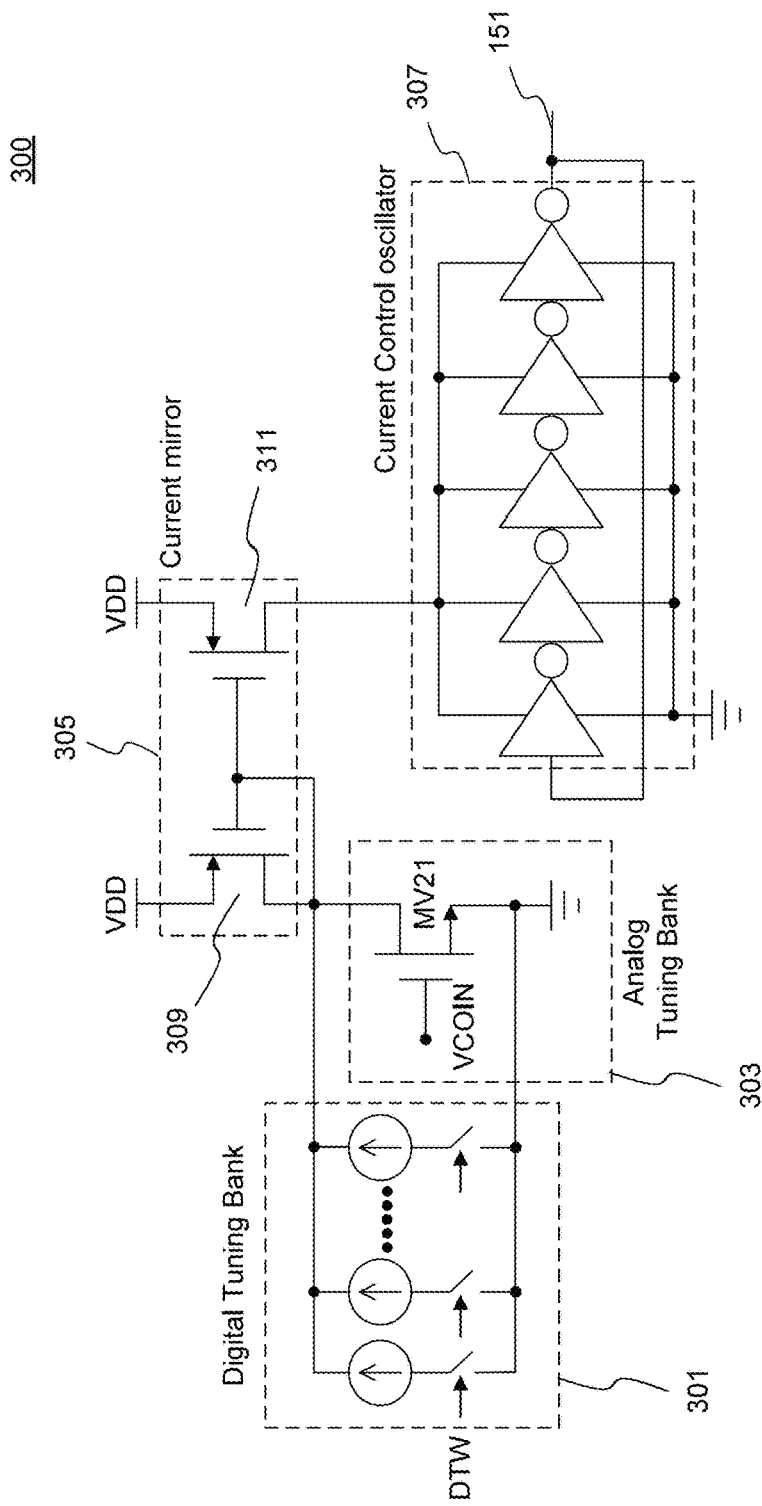
FIG. 3A is an exemplary implementation of a hybrid oscillator that can be implemented with a hybrid PLL, according to an embodiment of the present disclosure.

FIG. 3A illustrates an exemplary implementation of a hybrid oscillator that can be implemented with hybrid PLL 100, according to an embodiment of the present disclosure. In one example, hybrid oscillator 300 of FIG. 3A can be an implementation of hybrid oscillator 153 of FIG. 1. Hybrid oscillator 300 can be implemented using a digital tuning bank (DTB) 301, an analog tuning bank (ATB) 303, a current mirror 305, and a current controlled oscillator 307.

Digital tuning bank 301 includes one or more current sources and one or more switches. Each current source of digital tuning bank 301 is connected to a switch in series that constructs one digital tuning bit of digital tuning bank 301. The digital tuning bits are connected to each other in parallel. The switch of each digital tuning bit of bank 301 is controlled by the digital tuning word. The digital tuning word can include digital tuning word 107 of FIG. 1. Digital tuning bank 301 can be configured to provide a wide frequency tuning range. According to one example, the frequency tuning range of the digital tuning bank 301 can be divided into 32 steps using 32 of 5-bits binary codes. For example, a frequency range of 2.4 GHz can be divided into 32 steps each with a step size of 75 MHz. It is noted that other frequency ranges and/or other number of steps can also be used. According to one example digital tuning word 107 can be a thermometer code that controls digital tuning bank 301. A thermometer code can represent a natural number, N, with N ones followed by a zero (if the natural number is understood as non-negative integer) or with N−1 ones followed by a zero (if natural number is understood as strictly positive integer). In this example, the number of current sources of digital tuning bank 301 can be equal to the number of steps in the frequency range.

Analog tuning bank 303 can be implemented by a metal-oxide-semiconductor field-effect transistor (MOSFET) such as, but not limited to, a n-channel MOSFET. In one example, the transistor of analog tuning bank 303 has a gate terminal that receives the analog signal output voltage 121 (VCOIN) of FIG. 1. In this example, the source terminal of the transistor of analog tuning bank 303 can be coupled to a low voltage (such as ground) and also to digital tuning bank 301. The drain terminal of the transistor of analog tuning bank 303 can be coupled to current mirror 305 and also to digital tuning bank 301. Analog tuning bank 303 is configured to operate during the phase tracking mode of the hybrid PLL 100 using ACL 130 and is configured to convert output voltage 121 (VCOIN) to an output current. Analog tuning bank 303 provides a continuous and fine tuning mechanism to the hybrid PLL 100. In one example (as discussed in more detail with respect to FIG. 3B), analog tuning bank 303 provides a 750 MHz tuning range for a 0.25 volt tuning voltage. ACL 130 and analog tuning bank 303 perform the phase tracking mode of the hybrid PLL 100, and therefore, very small or no quantization noise is introduced in the steady state operation of the hybrid PLL 100 as usually seen in ADPLLs. It is noted that the illustrated analog tuning bank 303 is presented as an example, and other analog tuning bank circuits can also be used.

Hybrid oscillator 300 further includes a current mirror 305. On one side, current mirror 305 is coupled to digital tuning bank 301 and analog tuning bank 303. On the other side, current mirror 305 is coupled to current controlled oscillator (CCO) 307. Current mirror 305 is configured to combine the currents of digital tuning bank 301 and analog tuning bank 303 and to drive CCO 307. In a non-limiting example, current mirror 305 can include two p-channel MOFSETs 309 and 311. In this example, source terminals of transistors 309 and 311 are coupled to VDD. Drain and gate terminals of transistor 309 are coupled to each other and also coupled to digital tuning bank 301 and analog tuning bank 303 (e.g., to drain of the transistor of analog tuning bank 303.) The gate terminals of transistors 309 and 311 are coupled to each other, and the drain terminal of transistor 311 is coupled to CCO 307. It is noted that the implementation of current mirror 305 in FIG. 3A is an exemplary implementation and other implementations (e.g., active current mirror, high power supply rejection ratio (PSRR) active current mirror, wide-swing current mirrors, Wilson current mirror, etc.) also can be used.

Hybrid oscillator 300 also includes current controlled oscillator (CCO) 307. CCO 307 can include a ring oscillator and can be implemented using single-ended or differential multi-stages. Although CCO 307 is illustrated as a single-ended ring oscillator with five stages, the embodiments of this disclosure are not limited to this example and other CCOs can be used. CCO 307 is coupled to current mirror 305. Current mirror 305 is configured to control CCO to generate output signal 151 by controlling the amount of current supplied to CCO 307. Generally, the frequency of CCO 307 will increase with increasing current supply from current mirror 305. When hybrid PLL 100 operates in the frequency tracking mode using DCL 110, digital tuning word 107 controls digital tuning bank 301, which in turn controls CCO 307 through current mirror 305. When hybrid PLL 100 operates in the phase tracking mode using ACL 130, output voltage 121 (VCOIN) controls analog tuning bank 303, which in turn controls CCO 307 through current mirror 305.

Figure 3B:
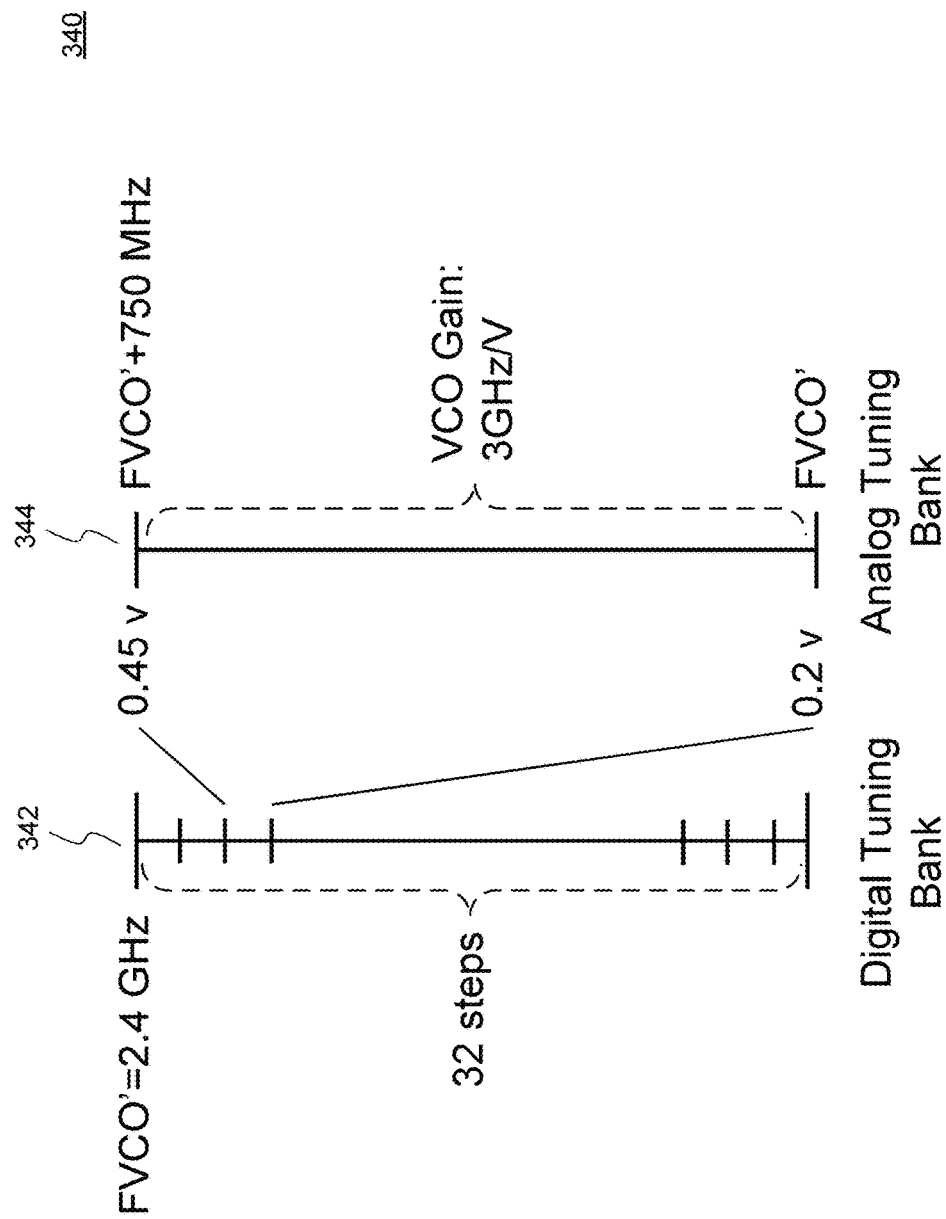
FIG. 3B is a frequency arrangement, according to an embodiment of the present disclosure.

FIG. 3B illustrates a frequency arrangement 340, according to an embodiment of the present disclosures. Frequency arrangement 340 of FIG. 3B illustrates a frequency range 342 that is covered by digital tuning bank 301 of FIG. 3A and a frequency range 344 covered by analog tuning bank 303 of FIG. 3A. It is noted that the frequency arrangement 340 is an exemplary arrangement and any other frequency arrangement can be used.

In the exemplary arrangement of FIG. 3B, the digital tuning bank 301 can have a frequency range of 2.4 GHz. In this example, the step size of digital tuning bank is determined by the frequency range of analog tuning bank divided by a constant (e.g., 10 in this example) The constant 10 in this example is a covering ratio of frequency range of analog tuning bank to step size of digital tuning bank. In other words, the frequency range of analog tuning bank covers 10 times of a step size of digital tuning bank. In the example of FIG. 3B, the frequency range 2.4 GHz of digital tuning bank is divided into 32 steps (e.g., thermometer code input to hybrid oscillator 115.) Therefore, each step in the frequency range of digital tuning bank is a 75 MHz step size. Each step in the frequency range of digital tuning bank corresponds to a fraction of the frequency range of the analog tuning bank. Considering the constant 10 discussed above, the frequency range of analog tuning bank would be 750 MHz. Given a voltage range of 0.25 volts (from 0.2 volts to 0.45 volts) for the analog tuning bank, the VCO gain of the analog tuning bank would be 3 GHz/V.

The frequency arrangement of FIG. 3B can be summarized in three equations. The first equation is that the frequency range of analog tuning bank is equal to the gain of VCO multiplied by the voltage range. The second equations is that the step size of digital tuning bank is equal to the frequency range of analog tuning bank divided by a constant (e.g., a covering ratio—for example 10 in the example above.) The third equation is that the number of steps of the digital tuning bank is equal to the frequency range of digital tuning bank divided by a step size of digital tuning bank. In one example, gain of VCO, voltage range, and frequency range of digital tuning bank are known values, from, for example, design specifications. Accordingly, the frequency range of the analog tuning bank, the step size of the digital tuning bank, and the number of steps of the digital tuning bank can be calculated using the equations discussed above.

Figure 4A:
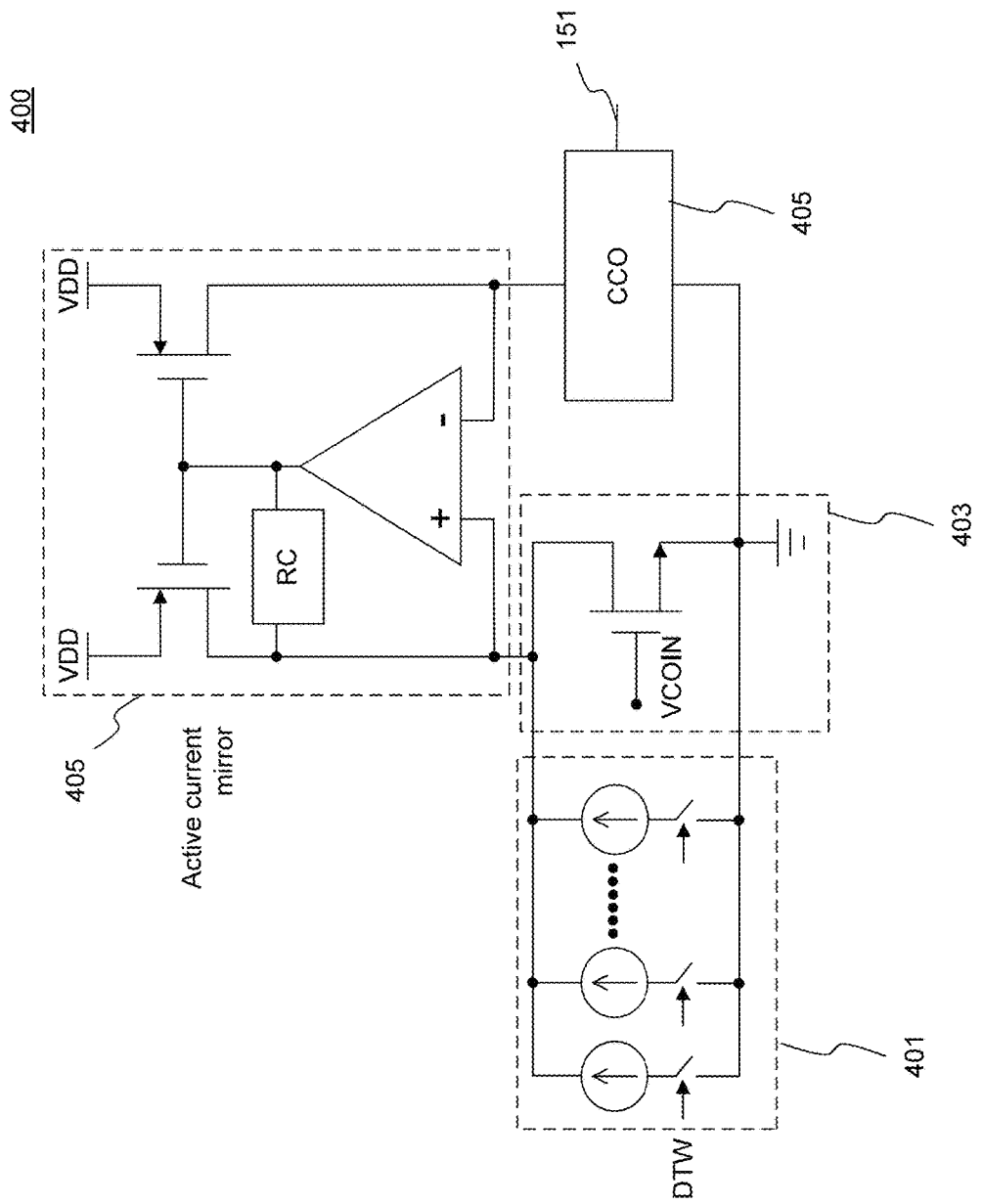
FIG. 4A is another exemplary implementation of a hybrid oscillator that can be implemented with a hybrid PLL, according to an embodiment of the present disclosure.

FIG. 4A illustrates another exemplary implementation of a hybrid oscillator that can be implemented with hybrid PLL 100, according to an embodiment of the present disclosure. In one example, hybrid oscillator 400 of FIG. 4A can be an implementation of hybrid oscillator 153 of FIG. 1. Hybrid oscillator 400 can be implemented using a digital tuning bank (DTB) 401, an analog tuning bank (ATB) 403, an active current mirror 405, and a current controlled oscillator (CCO) 407. Digital tuning bank 401, analog tuning bank 403, and current controlled oscillator 407 of hybrid oscillator 400 are similar to digital tuning bank 301, analog tuning bank 303 and a current controlled oscillator 307 of hybrid oscillator 300 of FIG. 3A, and therefore, are not discussed separately.

Hybrid oscillator 400 of FIG. 4A is further implemented using active current mirror 405. Current mirror 305 of hybrid oscillator 300 of FIG. 3A is replaced by active current mirror 405. In one embodiment, active current mirror 405 can include two p-channel MOFSETs, an amplifier, and a resistor-capacitor circuit (RC circuit). According to one example, using hybrid oscillator 400 can enhance power supply rejection ration (PSRR) of the hybrid PLL.

Figure 4B:
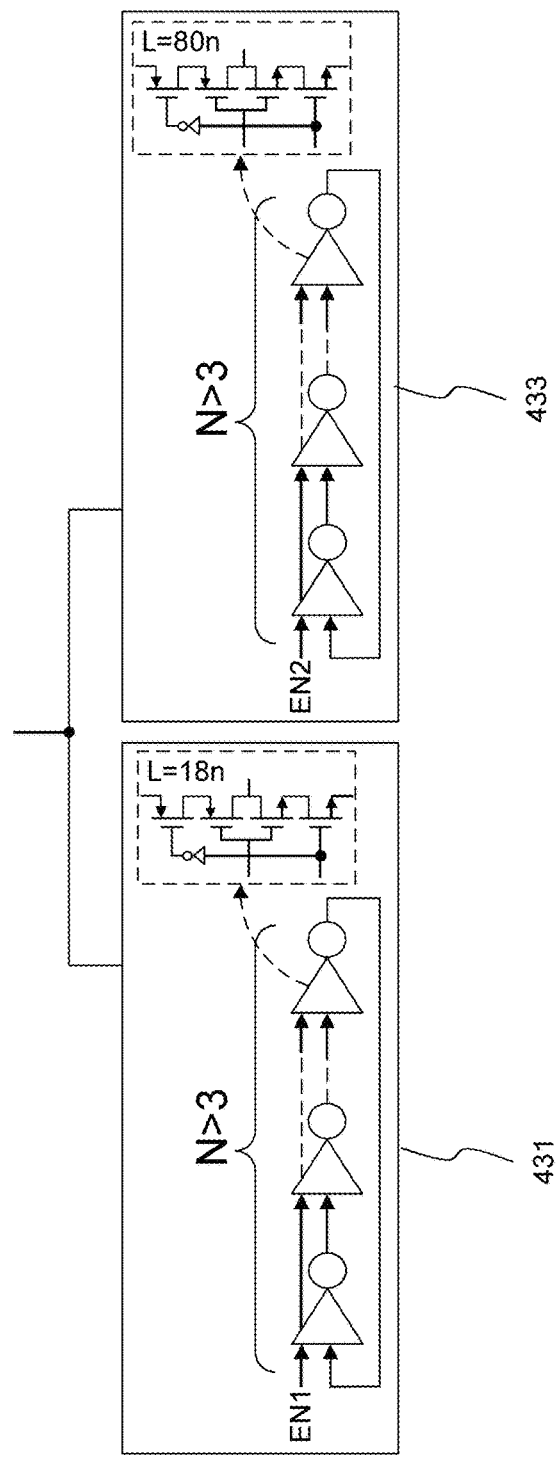
FIG. 4B is an exemplary implementation of a current controlled oscillator (CCO) that can be implemented with a hybrid PLL, according to an embodiment of the present disclosure.

FIG. 4B illustrates an exemplary implementation of a current controlled oscillator (CCO) that can be implemented with hybrid PLL 100, according to an embodiment of the present disclosure. In one example, CCO 307 of hybrid oscillator 300 of FIG. 3A and/or CCO 407 of hybrid oscillator 400 of FIG. 4A can be implemented using the example of FIG. 4B. FIG. 4B illustrates a multi-core CCO 430 that combines low power oscillator core 431 and high performance oscillator core 433. One difference between low power oscillator core 431 and high performance oscillator core 433 is the channel length of each device in the ring cell. The ring cell can be configured by tri-state inverter to make sure the oscillator core can be shut down completely when oscillator core is disabled. In one example, the channel length for each inverter in the low power oscillator core 431 can be 18 nm. In this example, the channel length for each inverter in the high performance oscillator core 433 can be 80 nm. Another example of a multi-core CCO is discussed in U.S. Patent Application Publication No. 2016-0072514, filed Sep. 26, 2014 and titled "Digitally Controlled Oscillator," which is incorporated by reference in its entirety. It is noted that multi-core CCO 430 of FIG. 4B is an exemplary implementation of a CCO and other implementations can also be used.

Figure 5:
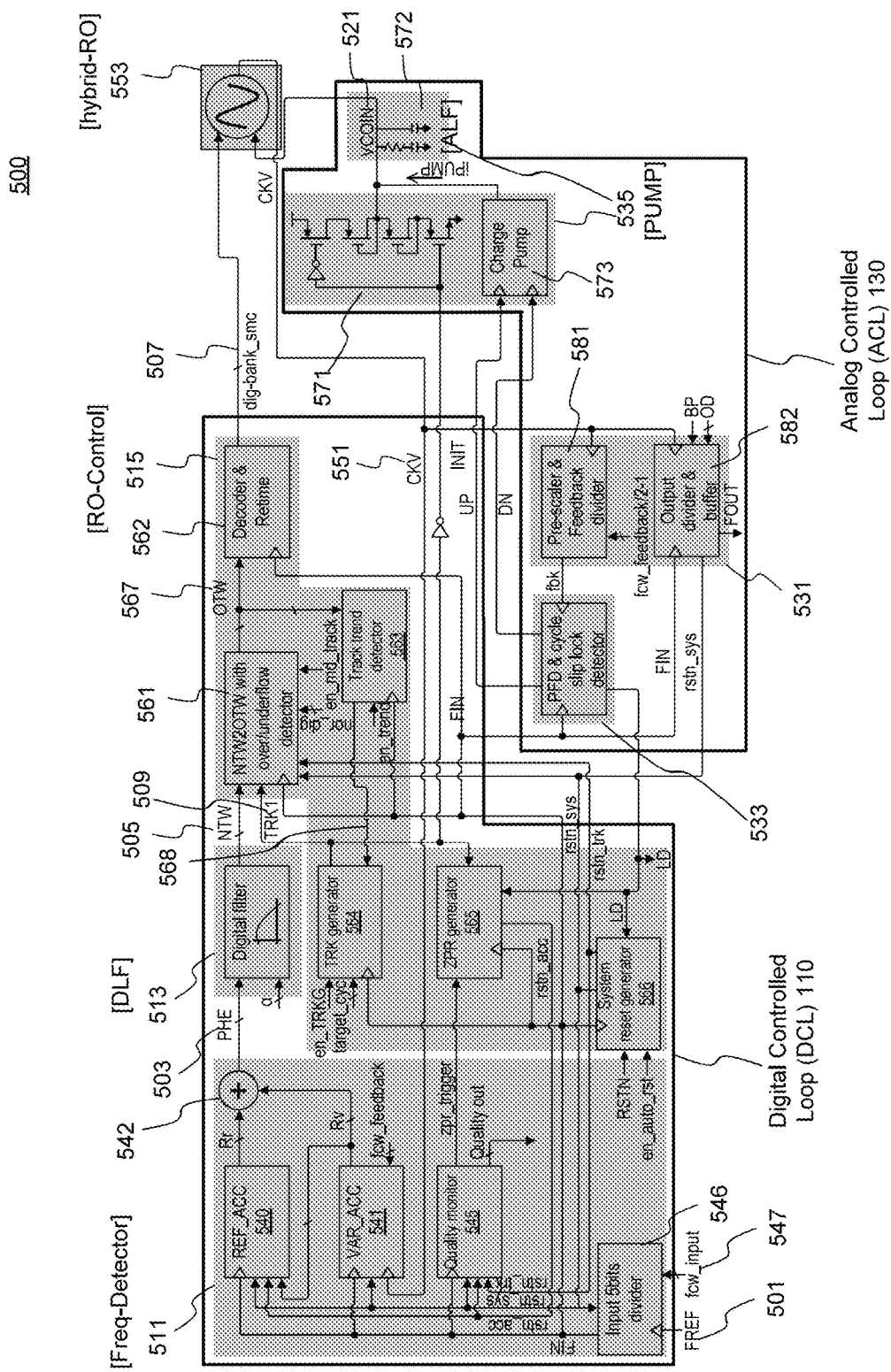
FIG. 5 is a more detailed implementation of a hybrid PLL, according to an embodiment of the present disclosure.

FIG. 5 is a block diagram of an exemplary hybrid PLL 500 according to an exemplary embodiment of the present disclosure. FIG. 5 illustrates a more detailed implementation of the hybrid PLL, such as hybrid PLL 100. Hybrid PLL 500 can be implemented using a frequency detector 511, a digital loop filter 513, an oscillator controller 515, a feedback divider 531, a phase frequency detector 533, a charge pump and analog filter 535, and a hybrid oscillator 553.

As illustrated in FIG. 5, frequency detector 511 includes a reference accumulator 540, a variable accumulator 541, a summing element 542, a quality monitor 545, and a divider 546. Divider 546 receives reference input signal 501 and a frequency control code 547, which is the ratio of the desired frequency of output signal 551 divided by the frequency of reference input signal 501. Reference accumulator 540 receives the output of divider 546 and generates a reference signal Rr, which is an accumulation of the frequency control code 547 at an active edge of the reference input signal 501.

Variable accumulator 541 receives the output of divider 546 and output signal 551. Variable accumulator 541 increments a count on each active edge of output signal 551, and generates a variable signal Rv. The summing element 542 determines the difference between the reference signal Rr and the variable signal Rv to determine error signal 503. In summary, frequency detector 511 is configured to convert the difference between reference input signal 501 and output signal 551 to a digital code (error signal 503.)

The error signal 503 is provided to digital loop filter 513. Digital loop filter 513 controls a normalized tuning word NTW 505 depending on error signal 503. Digital loop filter 513 includes a low-pass filter for attenuating unwanted spurs and phase noise at higher frequencies. For example, digital loop filter 513 scales down error signal 503 by $2^\alpha$ to generate normalized tuning word NTW 505. In one example normalized tuning word NTW 505 can be a binary signal with signed 2's complement.

Oscillator controller 515 is implemented using a detector 561, a decoder 562, a track trend detector 563, a track signal generator 564, a zero phase restart (ZPR) generator 565, and a system reset generator 566. Detector 561 is configured to receive normalized tuning word 505 and convert normalized tuning word 505 to an oscillator tuning code OTW 567. For example, detector 561 normalizes the normalized tuning word NTW 505 into the oscillator tuning code OTW 567 by multiplying the normalized tuning word NTW 505 with a normalization value. Decoder 562 is configured to receive OTW 567 and convert OTW 567 to digital tuning word 507 (such as a thermometer code, which is recognized by hybrid oscillator 553).

In addition to generating digital tuning word 507, OTW 567 can be used for detecting tracking trends. In one example, track trend detector 563 is configured to receive OTW 567 and is configured to determine when a switch between frequency tracking mode and phase tracking mode should be made. As discussed above and also in more detail below, the tracking mode detection can include a tracking from middle approach, a trend detection approach, etc. If track trend detector 563 determines that hybrid PLL 500 is to operate in the frequency tracking mode using DCL 110, track trend detector 563 triggers a signal 568 to tracking signal generator 564 to set tracking signal 509 at a first logical level (e.g., low logical level.) Tracking signal 509 is provided, through an inverter, to charge pump and analog filter 535 and more specifically, to voltage divider 571. When tracking signal 509 is at the first logical level (e.g., low logical level), voltage divider 571 is enabled and the output voltage of charge pump 573 and analog loop filer 572 is set to a fixed voltage by voltage divider 571.

If track trend detector 563 determines that hybrid PLL 500 is to operate in the phase tracking mode using ACL 130, track trend detector 563 triggers a signal 568 to tracking signal generator 564 to set tracking signal 509 at a second logical level (e.g., high logical level) When tracking signal 509 is at the second logical level (e.g., high logical level), voltage divider 571 is turned off to release VCOIN 521. In addition, tracking signal 509 is input to detector 561. When tracking signal 509 is at the second logical level (e.g., high logical level), detector 561 freezes OTW 567. Therefore, hybrid PLL 500 would operate using ACL 130 for the phase tracking mode. During the phase tracking mode, hybrid PLL 500 operates as an analog PLL using, in part, phase frequency detector 533 and divider 531. In one example, divider 531 can include a feedback divider 581 and an output divider 582.

During the frequency tracking mode where the operation of the hybrid PLL 500 is performed using DCL 110 and hybrid oscillator 553, frequency detector 511 converts the difference between reference input signal 501 and output signal 551 to error signal 503. Digital loop filter 513 controls a normalized tuning word NTW 505 depending on error signal 503. Since tracking signal 509 is at the first logical level (e.g., low logical level), detector 561 is enabled to convert normalized tuning word NTW 505 to oscillator tuning code OTW 567. Further, decoder 562 is configured to receive OTW 567 and convert OTW 567 to digital tuning word 507. Digital tuning word 507 is used to control hybrid oscillator 553 to track the frequency of reference input signal 501.

According to some embodiments, ZPR generator 565 of oscillator controller 515 is configured to send a pulse to reference accumulator 540 for aligning the output of reference accumulator 540 to the output of variable accumulator when hybrid PLL 500 enters phase tracking operation mode from frequency tracking operation mode. In one example, the pulse width of the pulse sent by ZPR generator 565 is about one period of reference input signal 501. According to some embodiments, system reset generator 566 is configured to determine whether hybrid PLL 500 needs to re-do frequency tracking. System reset generator 566 is configured to examine an LD signal, e.g., from phase frequency detector 533. If the LD signal goes to a low logical level from a high logical level, it means that hybrid PLL 500 needs to re-do frequency tracking. Therefore, system reset generator 566 is configured to send a signal (in one example, an rstn_acc/rstn_sys signal with a pulse width of about one period of reference input signal 501) to each block in hybrid-PLL. The input pin of "en_auto_rst" on system reset generator 566 can disable or enable this function.

Oscillator controller 515, and more specifically, track trend detector 563 and track signal generator 564 are configured to track trends, determine a change in a trend, and change the logical level of tracking signal 509. When tracking signal 509 is changed to a second logical level (e.g., high logical level), detector 561 will be disabled and hybrid PLL 500 will use ACL 130 to track the phase of the reference input signal. In the phase tracking mode, tracking signal 509 disables voltage divider 571 to release VCOIN 521. During the phase tracking mode of operation, ACL 130 and hybrid oscillator 553 can operate as an analog PLL. Output signal 551 (output from hybrid oscillator 553) is fed into divider 581 of feedback divider 531. Output of feedback divider 531, which is output signal 551 divided by a value, is fed to phase frequency detector 533. Phase frequency detector 533 is configured to detect the phase difference (and/or frequency difference) between feedback signal (output of feedback divider 581) and reference input signal 501. Phase frequency detector 533 generates two output signals—UP signal and DN signal. The pulse signals UP signal and DN signal are input to charge pump 573. Charge pump 573 converts the pulse signals UP signal and DN signal to an UP/DN current. Analog filter 572 coverts the UP/DN current output of the charge pump 573 into output voltage 521 (VCOIN). Output voltage 521 (VCOIN) is input to hybrid oscillator 553.

Traditionally, analog filters can occupy most of a PLL's area and the area of the analog filter can be dominated by the oscillator's gain and the PLL's bandwidth. Using a dual power analog PLL can reduce the size of the PLL compared to a single power analog PLL (in one example, this change in area is about 47%.) The hybrid PLLs of the embodiments of this disclosure can reduce the area of the PLL compared to a dual power analog PLL. In one example, the change in area is about 40% compared to dual power analog PLLs and about 70% compared to single power analog PLLs. This reduction in area in the hybrid PLLs of the embodiments of this disclosure are due, at least in part, to reduction in the oscillator's gain (because of the reduction in frequency range of the analog controlled loop.) In other words, the hybrid PLLs of the embodiments of this disclosure partition a wide frequency range (e.g., 2.4 GHz) into, for example, 32 smaller frequency ranges. Since the frequency range used by the analog controlled loop is smaller, the oscillator's gain is also reduced, which result in reduction of the hybrid PLL's area.

Figure 6:
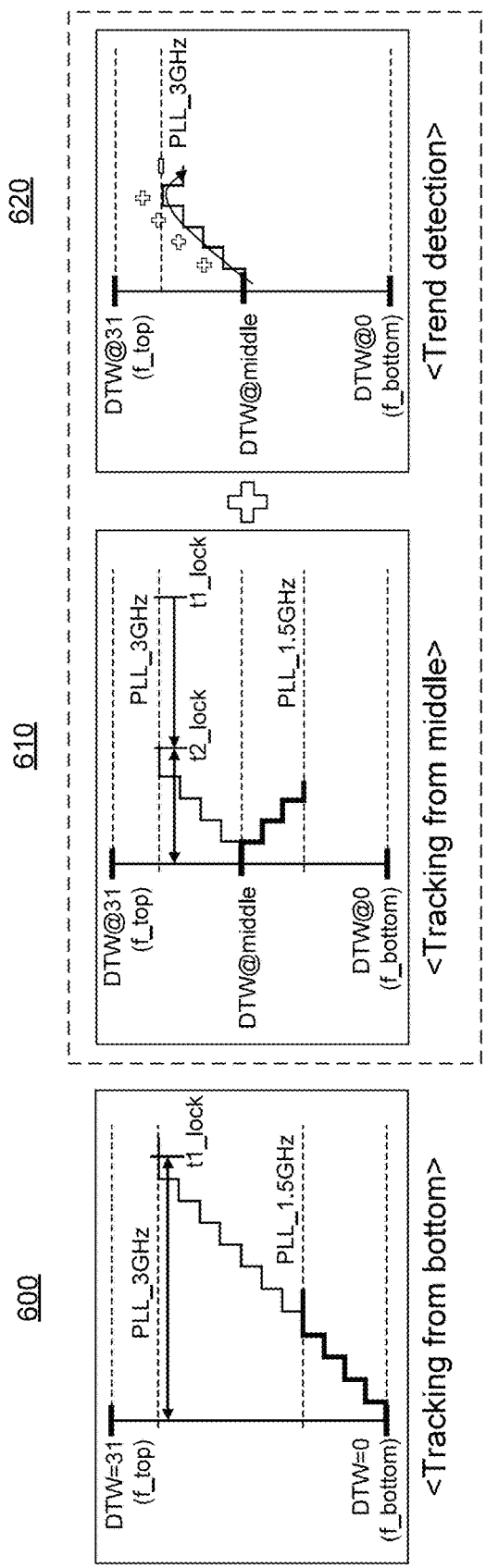
FIG. 6 depicts diagrams that illustrate trend detection, according to some embodiments of the disclosure.

FIG. 6 depicts diagrams that illustrate trend detection, according to some embodiments of the disclosure. In one example, the locking procedure of the hybrid PLL 100 and/or 500 can be described using diagram 600 and a trending procedure. In another example, the locking procedure of the hybrid PLL 100 and/or 500 can be described using diagrams 610 and 620.

In the locking procedure based on diagrams 600, the hybrid PLL 100 and/or 500 starts the locking procedure from the lowest frequency (f_bottom) of the frequency range of the hybrid PLL 100 and/or 500, where digital tuning word is zero. The hybrid PLL 100 and/or 500 increases the frequency in steps until the hybrid PLL 100 and/or 500 reaches the criteria of switching from frequency tracking mode to phase tracking mode. This criteria can be determined based on the trending mechanism discussed above. This locking procedure 600 can use the trend detection process as discussed above and also in U.S. patent application Ser. No. 15/135,212, filed Apr. 5, 2016 and titled "Automatic Detection of Change in PLL Locking Trend," which is incorporated by reference in its entirety and also summarized below with respect to diagram 620.

According to another example, in the locking procedure based on diagram 610, hybrid PLL 100 and/or 500 starts the locking procedure from the middle frequency of the frequency range of the PLL (e.g., middle digital tuning word.) As a comparison, diagram 600 illustrates that the tracking time is 11 reference cycles for a reference frequency of 3 GHz and is 4 cycles for a reference frequency of 1.5 GHz. Diagram 610, on the other hand, illustrates that the tracking time is 4 reference cycles for a reference frequency of 3 GHz and 3 cycles for a reference frequency of 1.5 GHz.

Diagram 620 illustrates an exemplary trend detection process in connection with diagram 610 (e.g., tracking from middle.) In this example, oscillator controller 115 of FIG. 1 monitors error signal 103 by analyzing signal 105 (which is derived from error signal 103) to determine a trend, for example, a positive trend, a flat trend, and/or a negative trend in the error signal 103. As the frequency $f_{OUT}$ and the frequency $f_{REF}$ converge, the error signal 103 decreases, and the error signal 103 increases when the frequency $f_{OUT}$ and the frequency $f_{REF}$ diverge. As shown in diagram 620, the error signal 103 can have a positive trend, for example, as the frequency $f_{OUT}$ converges with the frequency $f_{REF}$. The error signal 103 can have a negative trend, for example, as the frequency $f_{OUT}$ diverges from the frequency $f_{REF}$. The error signal 103 can have a flat trend, for example, when the frequency $f_{OUT}$ is approximately proportional to the frequency $f_{REF}$. In accordance with an embodiment of the present disclosure, when the hybrid PLL 100 and/or 500 detects a change in trend (e.g., from the positive trend to the flat trend), oscillator controller 115 can initiate the change in the tracking mode from frequency tracking using the DCL 110 to the phase tracking mode using the ACL 130.

Figure 7:
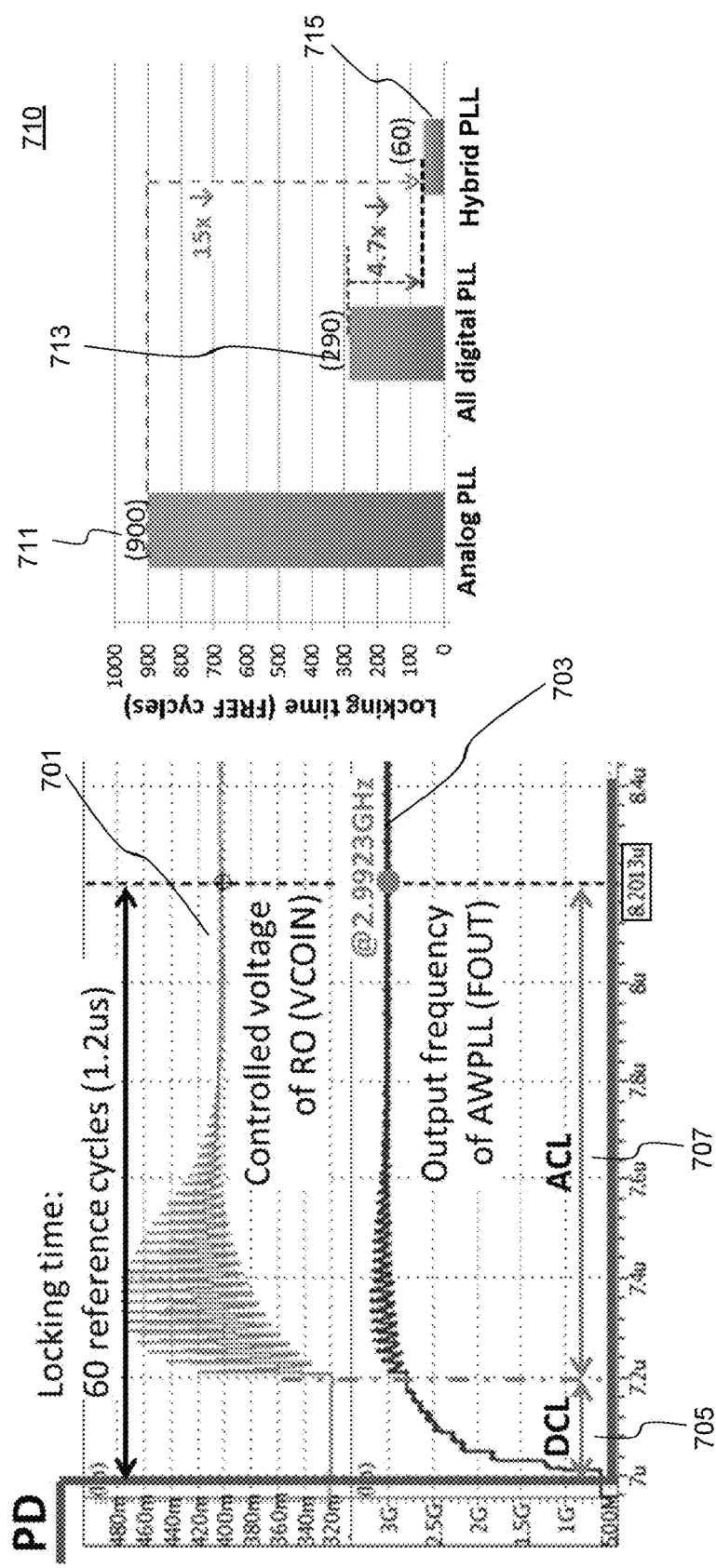
FIG. 7 illustrates simulated waveforms, according to an embodiment of the disclosure.

FIG. 7 illustrates simulated waveforms, according to an embodiment of the disclosure. Graph 701 illustrates the output voltage 121 (VCOIN) that is input to hybrid oscillator 153 of FIG. 1. When the hybrid PLL 100 and/or 500 is operating in the frequency tracking mode using the digital control loop (shown as range 705 on FIG. 7), output voltage 121 (VCOIN) is fixed. When the hybrid PLL 100 and/or 500 is operating in the phase tracking mode using the analog control loop (shown as range 707 on FIG. 7), output voltage 121 (VCOIN) controls hybrid oscillator 153. In this example, as shown in graph 701, hybrid PLL 100 and/or 500 locks to the reference input signal after around 60 reference cycles (e.g., 1.2 µs.)

Graph 703 illustrates the frequency of output signal 151 of FIG. 1. The hybrid PLL 100 and/or 500 is operating in the frequency tracking mode using the digital control loop in range 705, which takes around 0.2 µs. The hybrid PLL 100 and/or 500 is operating in the phase tracking mode using the analog control loop in range 707, which takes around 1 µs. The locked frequency in this example is 2.9923 GHz.

Graph 710 illustrates a comparison of locking time between an ADPLL, an analog PLL, and the hybrid PLL 100 and/or 500 of this disclosure. As shown in bar 711, it takes analog PLL around 900 reference cycles to lock to the frequency and/or phase of the reference input signal. Bar 713 illustrates that it take an ADPLL around 290 reference cycles to lock. For the hybrid PLL 100 and/or 500 of the embodiments of this disclosure, bar 715 shows that around 60 reference cycles are enough for locking.

Figure 8:
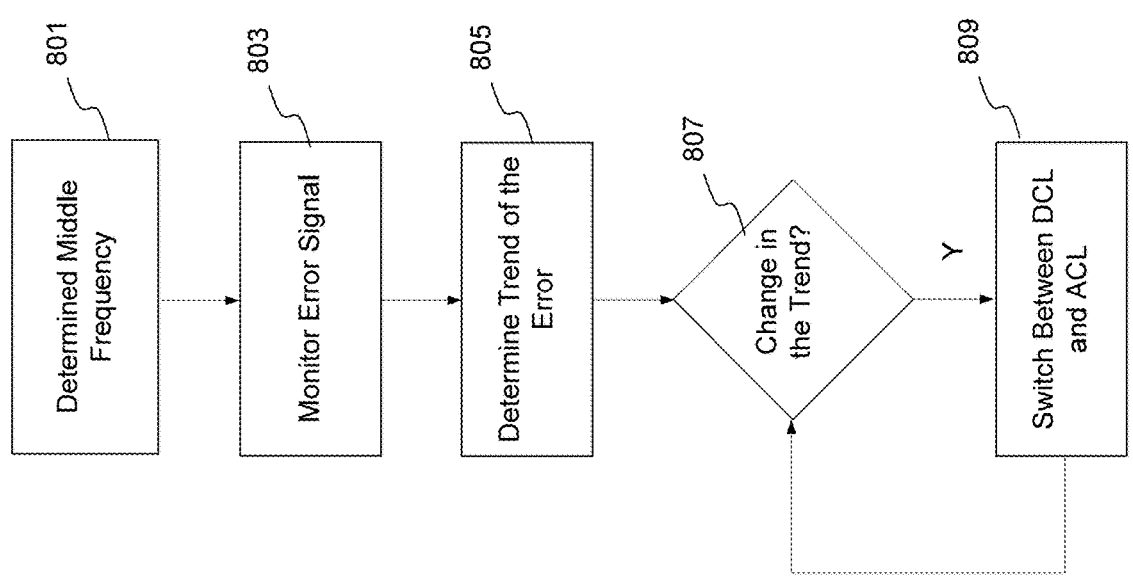
FIG. 8 is a flowchart illustrating an exemplary operational control flow, according to an embodiment of this disclosure.

FIG. 8 is a flowchart illustrating an exemplary operational control flow of oscillator controller 115, according to an embodiment of this disclosure. Method 800 of FIG. 8 can be performed by processing logic that can comprise hardware (e.g., circuitry, dedicated logic, programmable logic, microcode, etc.), software (e.g., instructions executing on a processing device), or a combination thereof. It is to be appreciated that not all steps may be needed to perform the disclosure provided herein. Further, some of the steps may be performed simultaneously, or in a different order than shown in FIG. 8, as will be understood by a person of ordinary skill in the art.

Method 800 shall be described with reference to FIG. 1. However, method 800 is not limited to that example embodiment. Also, the operation of oscillator controller 115 is not limited to this operation control flow and other operational control flows are within the scope and spirit of present disclosure.

In this exemplary method, the hybrid PLL 100 and/or 500 starts the locking procedure from the middle frequency of the frequency range of the PLL. At 801, oscillator controller 115 determines the middle frequency in the frequency range for the locking procedure. At 803, oscillator controller 115 (and more specifically, for example, track trend detector 563) monitors error signal 103 through analyzing signal 105. As discussed above, signal 105 is derived from error signal 103 going through digital loop filter 113. Monitoring error signal 103 can include collecting one or more samples of signal 105.

At 805, oscillator controller 115 (and more specifically, for example, track trend detector 563) determines the trend of the error signal 103 based on the one or more collected samples from signal 105 to determine the trend of error signal 103. At 807, oscillator controller 115 continues to monitor error signal 103. For example, oscillator controller 115 collects one or more additional samples of signal 105 and determines the trend of the error signal 103 for the additional samples. Oscillator controller 115 (and more specifically, for example, track trend detector 563) compares the new trend with the initial trend to determine whether the trend of error signal 103 has changed. Method 800 remains at 805 until oscillator controller 115 (and more specifically, for example, track trend detector 563) detects a change in the trend of error signal 103. When the change is detected, the method moves to 809.

At 809, oscillator controller 115 can switch between digital controlled loop 110 and analog controlled loop 130 based on the detected change in the trend of error signal 103. For example, oscillator controller 115 configures hybrid PLL 100 to stop using DCL 110 (disables DCL 110 or at least part of DCL 110) and configures hybrid PLL 100 to use ACL 130 (enables ACL 130). Hybrid oscillator 153 will use the ACL 130 for the phase tracking mode of operation of hybrid PLL 100.

Similarly, oscillator controller 115 can configures hybrid PLL 100 to stop using ACL 130 (disables ACL 130) and configures hybrid PLL 100 to use DCL 110 (enables DCL 110 or at least part of DCL 110). Hybrid oscillator 153 will use the DCL 110 for the frequency tracking mode of operation of hybrid PLL 100. For example, hybrid oscillator 153 is controlled using digital tuning word 107 and/or 507 generated by DCL 110. The operational control flow can revert to 807 to continue to monitor error signal 103 for other changes in the trend of error signal 103.

The foregoing Detailed Description disclose a hybrid PLL includes a digital controlled loop that receives a reference input signal and an output signal of the hybrid PLL, and generates a digital tuning word. The hybrid PLL further includes an analog controlled loop that receives the reference input signal and the output signal of the hybrid PLL, and generates an output voltage. The hybrid PLL also includes a hybrid oscillator coupled to the digital controlled loop and the analog controlled loop. The digital controlled loop includes an oscillator controller. The oscillator controller controls the hybrid oscillator using the digital tuning word and disables the analog controlled loop during a frequency tracking operation mode of the hybrid PLL. The oscillator controller enables the analog controlled loop to control the hybrid oscillator during the phase tracking operation mode of the hybrid PLL.

The foregoing Detailed Description additionally disclose a hybrid PLL, which includes a digital controlled loop that is implemented using digital components and operates during a frequency tracking mode. The hybrid PLL also includes an analog controlled loop that is implemented using analog components and operates during a phase tracking mode. The hybrid PLL further includes an oscillator controller. The oscillator controller receives an error signal, determines a trend of the error signal, and compares the trend of the error signal to a previous trend of the error signal. The oscillator controller further enables or disables the analog controlled loop upon detecting a change in the trend of the error signal.

The foregoing Detailed Description additionally disclose a method for operating a hybrid phase lock loop (PLL). The method includes, during a frequency tracking operation mode of the hybrid PLL, controlling a hybrid oscillator using a digital tuning word generated by a digital controlled loop and disabling an analog controlled loop. The method further includes, during a phase tracking operation mode of the hybrid PLL, enabling the analog controlled loop to control the hybrid oscillator.

The hybrid PLL of the embodiments of this disclosure combine the advantages of digital PLLs and analog PLLs. In other words, the hybrid PLL of the embodiments of this disclosure combine the fast tracking and oscillator-gain reduction of the digital controlled loop with the continuous tuning mechanism and quantization noise free of the analog controlled loop. Further, the area of the hybrid PLL of the embodiments of this disclosure can be smaller than traditional PLLs. Also, the hybrid PLL of the embodiments of this disclosure can improve the jitter contributed by, for example, power supply's noise. The hybrid PLL of the embodiments of this disclosure can also be placed at anywhere on a chip without a dedicated power supply. Accordingly the hybrid PLL of the embodiments of this disclosure can also be considered as anywhere PLL that can operate in a low power consumption mode and/or a high performance mode.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A hybrid phase lock loop (PLL), comprising:
    a digital controlled loop configured to receive a reference input signal and an output signal of the hybrid PLL, and to generate a digital tuning word;
    an analog controlled loop configured to receive the reference input signal and the output signal of the hybrid PLL, and to generate an output voltage; and
    a hybrid oscillator coupled to the digital controlled loop and the analog controlled loop,
    wherein the digital controlled loop comprises an oscillator controller configured to:
        control the hybrid oscillator using the digital tuning word and disable the analog controlled loop during a frequency tracking operation mode of the hybrid PLL; and
        enable the analog controlled loop to control the hybrid oscillator during a phase tracking operation mode of the hybrid PLL.

2. The hybrid PLL of claim 1, wherein the digital controlled loop further comprises:
    a frequency detector configured to compare a first frequency of the reference input signal and a second frequency of the output signal of the hybrid PLL to provide an error signal.

3. The hybrid PLL of claim 1, wherein the analog controlled loop comprises:
    a phase detector configured to compare a first phase of the reference input signal and a second phase of a second time-varying signal represented with a signal associated with the output signal of the hybrid PLL to provide an error signal.

4. The hybrid PLL of claim 1, wherein hybrid oscillator comprises:
    a digital tuning bank coupled to the digital controlled loop and configured to receive the digital tuning word;
    an analog tuning bank coupled to the analog controlled loop and configured to receive the output voltage;
    a current mirror coupled to the digital tuning bank and the analog tuning bank; and
    a current controlled oscillator coupled to the current mirror.

5. The hybrid PLL of claim 4, wherein the current mirror comprises an active current mirror.

6. The hybrid PLL of claim 4, wherein the digital tuning bank comprises a plurality of current sources, wherein each current source is coupled in series with a switch and the switches are controlled by the digital tuning word.

7. The hybrid PLL of claim 1, wherein:
    during the frequency tracking operation mode, the output voltage of the analog controlled loop is set to a fixed voltage; and
    during the phase tracking operation mode, the output voltage of the analog controlled loop tracks phase of the reference input signal.

8. The hybrid PLL of claim 1, wherein the oscillator controller is configured to set a tracking signal to a first logical level during the frequency tracking operation mode of the hybrid PLL and to set the tracking signal to a second logical level during the phase tracking operation mode of the hybrid PLL.

9. The hybrid PLL of claim 1, wherein the oscillator controller comprises:
    a detector configured to receive an error signal and generate an oscillator tuning code; and
    a track trend detector configured to:
        receive the oscillator tuning code;
        detect a condition for switching between the frequency tracking operation mode and the phase tracking operation mode; and
        generate an output signal when the condition is detected.

10. The hybrid PLL of claim 9, wherein the oscillator controller further comprises:
a tracking signal generator configured to:
receive the output signal of the track trend detector; and
generate a tracking signal based on the output signal of the track trend detector,
wherein the tracking signal generator is further configured to:
set the tracking signal to a first logical level during the frequency tracking operation mode of the hybrid PLL, and
set the tracking signal generator to a second logical level during the phase tracking operation mode of the hybrid PLL.

11. The hybrid PLL of claim 10, wherein the analog controlled loop is configured to receive the tracking signal and is configured to set the output voltage to a fixed value when the tracking signal is set to the first logical level.

12. The hybrid PLL of claim 1, wherein the digital controlled loop is implemented using digital components.

13. The hybrid PLL of claim 12, wherein the analog controlled loop is implemented using analog components.

14. The hybrid PLL of claim 13, wherein the hybrid oscillator is implemented using analog components.

15. A hybrid phase lock loop (PLL), comprising:
a digital controlled loop implemented using digital components and configured to operate during a frequency tracking operation mode;
an analog controlled loop implemented using analog components and configured to operate during a phase tracking operation mode; and
an oscillator controller configured to:
receive an error signal;
determine a trend of the error signal;
compare the trend of the error signal to a previous trend of the error signal, and
enable or disable the analog controlled loop upon detecting a change in the trend of the error signal.

16. The hybrid PLL of claim 15, wherein the trend comprises:
a positive trend indicating that a value of the error signal has increased from a previous value of the error signal;
a negative trend indicating that the value of the error signal has decreased from the previous value of the error signal; or
a flat trend indicating that the value of the error signal is substantially unchanged from the previous value of the error signal.

17. The hybrid PLL of claim 15, wherein the oscillator controller is configured to set a tracking signal to a first logical level during the frequency tracking operation mode of the hybrid PLL and to set the tracking signal to a second logical level during the phase tracking operation mode of the hybrid PLL.

18. The hybrid PLL of claim 15, further comprising:
a hybrid oscillator coupled to the digital controlled loop and the analog controlled loop, wherein the hybrid oscillator is implemented using analog components.

19. A method for operating a hybrid phase lock loop (PLL), the method comprising:
during a frequency tracking operation mode of the hybrid PLL:
controlling a hybrid oscillator using a digital tuning word generated by a digital controlled loop; and
disabling an analog controlled loop; and
during a phase tracking operation mode of the hybrid PLL:
enabling the analog controlled loop to control the hybrid oscillator.

20. The method of claim 19, further comprising:
setting a tracking signal to a first logical level during the frequency tracking operation mode of the hybrid PLL; and
setting the tracking signal to a second logical level during the phase tracking operation mode of the hybrid PLL.

* * * * *